(12) United States Patent
Fan

(10) Patent No.: US 8,952,733 B2
(45) Date of Patent: Feb. 10, 2015

(54) FREQUENCY MULTIPLIER CIRCUIT AND SYSTEM

(71) Applicant: IPGoal Microelectronics (Sichuan) Co., Ltd., Chengdu, Sichuan (CN)

(72) Inventor: Fangping Fan, Sichuan (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 13/951,331

(22) Filed: Jul. 25, 2013

(65) Prior Publication Data
US 2014/0028359 A1 Jan. 30, 2014

(30) Foreign Application Priority Data
Jul. 30, 2012 (CN) ............................ 2012 1 0264743

(51) Int. Cl.
*H03B 19/00* (2006.01)
*H03B 19/14* (2006.01)

(52) U.S. Cl.
CPC ...................... *H03B 19/14* (2013.01)

USPC .......................................... 327/122; 327/119

(58) Field of Classification Search
CPC ........ H03B 19/00; H03B 19/10; H03B 19/14; H03K 5/00006
USPC ............. 327/113, 114, 116, 119, 122; 377/47
See application file for complete search history.

(56) References Cited

U.S. PATENT DOCUMENTS

| 7,546,095 | B2 * | 6/2009 | Arimura ........................ 455/112 |
| 8,519,753 | B2 * | 8/2013 | Marshall ....................... 327/114 |
| 2011/0215844 | A1 * | 9/2011 | Trotta et al. .................. 327/122 |

* cited by examiner

Primary Examiner — Patrick O'Neill

(57) ABSTRACT

A frequency multiplier circuit includes a first signal input terminal, a second signal input terminal, an output terminal, a power source terminal, a ground terminal, a main control circuit which is connected to the first signal input terminal, the second signal input terminal, the power source terminal and the ground terminal, a reference circuit which is connected to the power source terminal and the ground terminal, and a frequency synthesis circuit which is connected to the main control circuit, the reference circuit, the output terminal, the power source terminal and the ground terminal.

2 Claims, 1 Drawing Sheet

FREQUENCY MULTIPLIER CIRCUIT AND SYSTEM

BACKGROUND OF THE PRESENT INVENTION

1. Field of Invention

The present invention relates to a frequency multiplier, and more particularly to a frequency multiplier circuit which is simple in structure and easy to cascade and provides precise frequency multiplication and a system thereof.

2. Description of Related Arts

The frequency multiplier is a circuit which generates an output signal whose frequency is a multiple of the frequency of an input frequency, for accomplishing multiplying frequency signals. Generally, a working clock of a digital circuit requires the frequency multiplier to have a high precision and a low noise. The ratio of the input clock to the input clock is called the frequency multiplication times.

The conventional frequency multiplier usually has a structure of phase locked loop (PLL) to satisfy requirements of the high precision and the low noise, but the structure has defects of a big cost of chips and difficulty in designing. Thus it is necessary to provide a frequency multiplier which has a simple structure and a small area of chips and is easy to cascade.

SUMMARY OF THE PRESENT INVENTION

An object of the present invention is to provide a frequency multiplier circuit which is simple, cheap and easy to cascade and provides precise frequency multiplication.

A frequency multiplier circuit comprises a first signal input terminal, a second signal input terminal, an output terminal, a power source terminal and a ground terminal. The frequency multiplier circuit further comprises a main control circuit which is connected to the first signal input terminal, the second signal input terminal, the power source terminal and the ground terminal, a reference circuit which is connected to the power source circuit and the ground terminal, and a frequency synthesis circuit which is connected to the main control circuit, the reference circuit, the output terminal, the power source terminal and the ground terminal. The main control circuit comprises a first field effect transistor (FET) connected to the first signal input terminal, a second FET connected to the second signal input terminal, a third FET connected to the first FET and the second FET, a fourth FET connected to the first FET, the third FET and the power source terminal, and a fifth FET connected to the second FET, the third FET, the fourth FET and the power source terminal. The reference circuit comprises a sixth FET connected to the ground terminal, a seventh FET connected to the sixth FET, and an eighth FET which is connected to the sixth FET, the seventh FET and the power source terminal. The frequency synthesis circuit comprises a comparator which I connected to the third FET, the fourth FET, the fifth FET, the sixth FET, the seventh FET, the eighth FET and the output terminal.

A frequency multiplier system comprises a first signal input terminal, a second signal input terminal, an output terminal, a power source terminal and a ground terminal. The frequency multiplier system further comprises a main control circuit for detecting signals which are inputted by the first signal input terminal and the second signal input terminal, a reference circuit for supplying the main control circuit with reference voltages, and a frequency synthesis circuit for synthesizing a frequency of an output voltage V1 of the main control circuit with a frequency of a reference voltage V2 of the reference circuit. The first signal input terminal and the second signal input terminal input a pair of differential signals into the main control circuit; the main control circuit detects the pair of differential signals and then the output voltage V1 is obtained; and the output voltage V1 and the reference voltage V2 of the reference circuit enter the frequency synthesis circuit together and the frequency synthesis circuit synthesizes a frequency of the output voltage V1 with a frequency of the reference voltage V2, in such a manner that a frequency-doubled signal is obtained and outputted into the output terminal.

Compared with prior arts, the frequency multiplier circuit and the system thereof, provided by the present invention, are able to double frequency precisely and have advantages of a big bandwidth, a simple structure and being easy to cascade.

These and other objectives, features, and advantages of the present invention will become apparent from the following detailed description, the accompanying drawings, and the appended claims.

DETAILED DESCRIPTION OF THE PREFERRED EMBODIMENT

Figure 1:
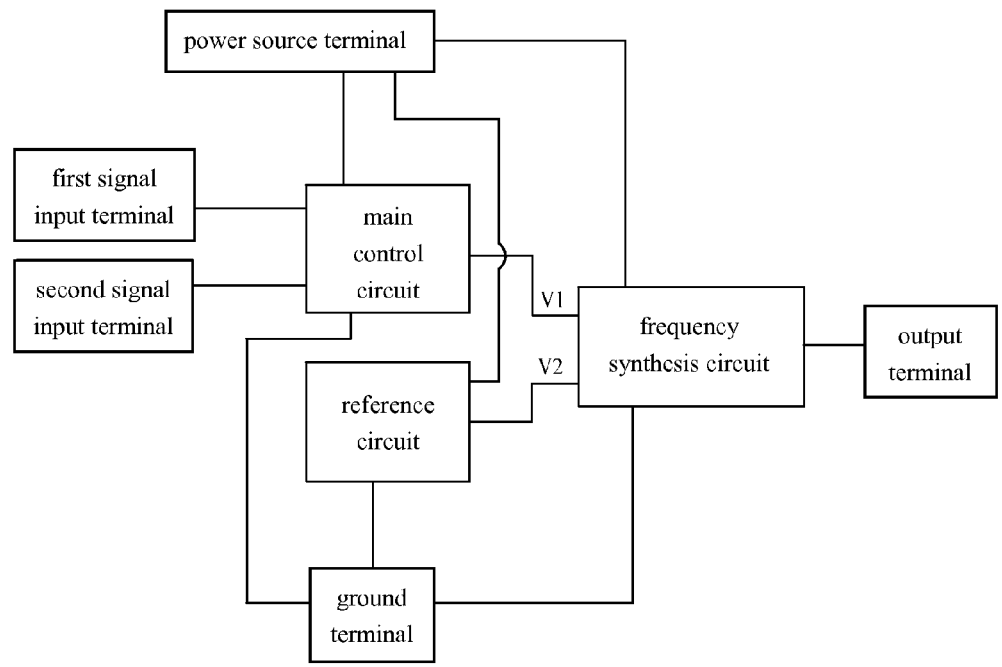
FIG. 1 is a block diagram of a frequency multiplier system according to a preferred embodiment of the present invention.

Referring to FIG. 1 of the drawings, according to a preferred embodiment of the present invention, a frequency multiplier circuit comprises a first signal input terminal Vin, a second signal input terminal Vip, an output terminal Vout, a power source terminal VCC, a ground terminal GND, a main control circuit which is connected to the first signal input terminal Vin, the second signal input terminal Vip, the power source terminal VCC and the ground terminal GND, and a frequency synthesis circuit which is connected to the main control circuit, the reference circuit, the output terminal Vout, the power source terminal VCC and the ground terminal GND.

Figure 2:
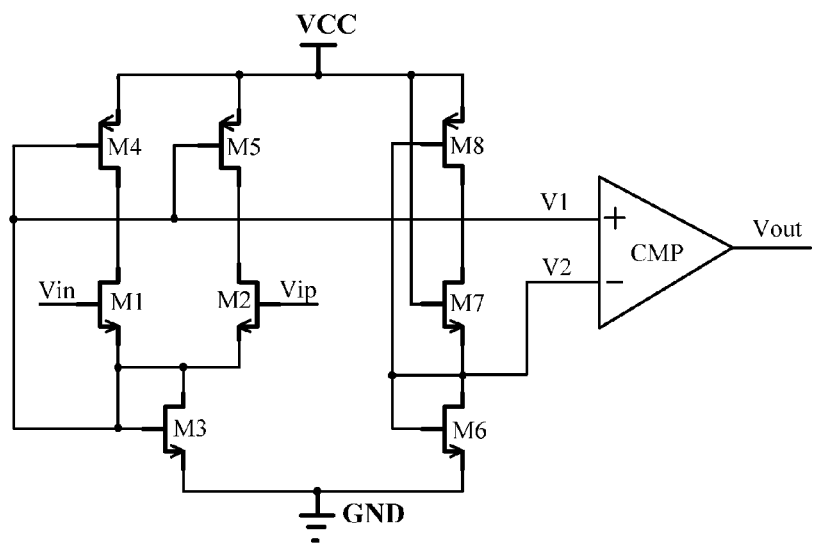
FIG. 2 is a sketch view of a frequency multiplier circuit according to the preferred embodiment of the present invention.

Further referring to FIG. 2, according to the preferred embodiment of the present invention, a frequency multiplier circuit is showed, wherein the main control circuit comprises a first FET M1, a second FET M2, a third FET M3, a fourth FET M4, a fifth FET M5; the reference circuit comprises a sixth FET M6, a seventh FET M7, an eighth FET M8; and the frequency synthesis circuit comprises a comparator CMP.

According to the preferred embodiment of the present invention, the frequency multiplier circuit has following connections. A gate electrode of the first FET M1 is connected to the first signal input terminal Vin; a gate electrode of the second FET M2 is connected to the second signal input terminal Vip; a source electrode of the first FET M1, a source electrode of the second FET M2, a gate electrode and a drain electrode of the third FET M3, a gate electrode of the fourth FET M4, a gate electrode of the fifth FET M5 and a non-inverting input terminal V1 of the comparator CMP are all connected; a drain electrode of the first FET M1 is connected to a drain electrode of the fourth FET M4; a drain electrode of the second FET M2 is connected to a drain electrode of the fifth FET M5; a gate electrode and a drain electrode of the sixth FET M6, a source electrode of the seventh FET M7, a gate electrode of the eighth FET M8 and an inverting input terminal V2 of the comparator CMP are all connected; a drain electrode of the seventh FET M7 is connected to a drain electrode of the eighth FET M8; a source electrode of the third FET M3 and a source electrode of the sixth FET M6 are both connected to the ground terminal GND; a source electrode of the fourth FET M4, a source electrode of the fifth FET M5, a gate electrode of the seventh FET M7 and a source electrode of the eighth FET M8 are all connected to the power source terminal VCC; and an output of the comparator CMP is connected to the output terminal Vout.

A frequency multiplier system comprises a first signal input terminal Vin, a second signal input terminal Vip, an output terminal Vout, a main control circuit for detecting signals which are inputted by the first signal input terminal Vin and the second signal input terminal Vip, a reference circuit for supplying the main control circuit with reference voltages, and a frequency synthesis circuit for synthesizing a frequency of an output voltage V1 of the main control circuit with a frequency of a reference voltage V2 of the reference circuit. The first signal input terminal Vin and the second signal input terminal Vip input a pair of differential signals into the main control circuit; the main control circuit detects the pair of differential signals and then the output voltage V1 is obtained; the output voltage V1 and the reference voltage V2 of the reference circuit enter the frequency synthesis circuit together and the frequency synthesis circuit synthesizes the frequency of the output voltage V1 with the frequency of the reference voltage V2, in such a manner that a frequency-doubled signal is obtained and outputted into the output terminal.

According to the preferred embodiment of the present invention, the frequency multiplier and the system thereof have following working principles. The first signal input terminal Vin and the second signal input terminal Vip together input a pair of differential signals into the main control circuit; the pair of differential signals is detected by the main control circuit and then an output voltage V1 is obtained; the output voltage V1 and a reference voltage V2 of the reference circuit together enter the frequency synthesis circuit and the frequency synthesis circuit synthesizes a frequency of the output voltage V1 and a frequency of the reference voltage V2, in such a manner that a frequency-doubled signal is obtained and outputted into the output terminal Vout.

In order to analyze the working principles of the frequency multiplier and the system thereof, a supposition is made as follows. Firstly, a width to length ratio of the third FET M3 is set to be bigger than that of the sixth FET M6; for example, the width to length ratio of the third FET M3 is twice as big as that of the sixth FET M6. Then, the width to length ratios of the first FET M1, the second FET M2 and the seventh FET M7 are all set to be identical; the width to length ratios of the fourth FET M4, the fifth FET M5 and the eight FET M8 are all set to be identical; and the first signal input terminal Vin and the second signal input terminal Vip are set to input a pair of differential signals which have a signal swing from the power source terminal VCC to the ground terminal GND.

Based on the above supposition, the working principles of the frequency multiplier circuit and the system thereof are analyzed in following three conditions.

(1) When the first signal input terminal Vin has an identical voltage value with the second signal input terminal Vip, the first FET M1, the second FET M2, the fourth FET M4 and the fifth FET M5 are all conductive and a current running through the third FET M3 reaches a biggest value, i.e., the output voltage V1 reaches a highest level.

(2) When the voltage value of the first signal input terminal Vin gradually becomes smaller than the voltage value of the second signal input terminal Vip, the current running through the third FET M3 decreases gradually, i.e., the output voltage V1 also decrease gradually. When a negative difference between the voltage value of the first signal input terminal Vin and the voltage value of the second signal input terminal Vip reaches a highest level, the first FET M1 and the fourth FET M4 are totally turned off; the second FET M2 and the fifth FET M5 are conductive; and the current running through the third FET M3 reaches a smallest value, i.e., the output voltage V1 reaches a lowest level.

(3) When the voltage value of the first signal input terminal Vin gradually becomes larger than the voltage value of the second signal input terminal Vip, the current running through the third FET M3 decreases gradually, i.e., the output voltage V1 also decreases gradually. When a positive difference between the voltage value of the first signal input terminal Vin and the voltage value of the second signal input terminal Vip reaches a highest level, the first FET M1 and the fourth FET M4 are conductive; the second FET M2 and the fifth FET M5 are totally turned off; and the current running through the third FET M3 reaches the smallest value, i.e., the output voltage V1 reaches the lowest level.

According to the above analyzing, the output voltage V1 changes along with the difference between the voltage value of the first signal input terminal Vin and the voltage value of the second signal input terminal Vip and is inversely proportional to an absolute value of the difference. Within one cycle, the difference reaches the highest level twice, i.e., the output voltage V1 reflects doubled frequency information of the voltage value of the first signal input terminal Vin and the voltage value of the second signal input terminal Vip. Moreover, the sixth FET M6, the seventh FET M7 and the eighth FET M8 together generate a reference voltage V2 whose value is set to be a middle value between the highest level and the lowest level of the output voltage V1. The comparator CMP compares the output voltage V1 with the reference voltage V2, in such a manner that a signal whose frequency is twice as big as the frequency of the differential signals which are inputted by the first signal input terminal Vin and the second signal input terminal Vip is outputted.

As a result, the frequency multiplier circuit and the system thereof, provided by the present invention, are able to precisely double the frequency by extracting the double frequency information from the inputted differential signals and transforming the double frequency information into an output which has a frequency twice of the frequency of the inputted signal; the frequency multiplier circuit and the system thereof are also simple, feasible, cheap and easy to cascade.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A frequency multiplier circuit, comprising a first signal input terminal, a second signal input terminal, an output terminal, a power source terminal, a ground terminal, a main control circuit which is connected to said first signal input terminal, said second signal input terminal, said power source terminal and said ground terminal, a reference circuit which is connected to said power source terminal and said ground terminal, and a frequency synthesis circuit which is connected to said main control circuit, said reference circuit, said output terminal, said power source terminal and said ground terminal;

wherein said main control circuit comprises a first FET connected to said first signal input terminal, a second FET connected to said second signal input terminal, a third FET which is connected to said first FET and said second FET, a fourth FET which is connected to said first FET, said third FET and said power source terminal, and a fifth FET which is connected to said second FET, said third FET, said fourth FET and said power source terminal; said reference circuit comprises a sixth FET connected to said ground terminal, a seventh FET connected to said sixth FET, an eighth FET which is connected to said sixth FET, said seventh FET and said power source terminal; and said frequency synthesis circuit comprises a comparator which is connected to said third FET, said fourth FET, said fifth FET, said sixth FET, said seventh FET, said eighth FET and said output terminal.

2. The frequency multiplier circuit, as recited in claim 1, wherein a gate electrode of said first FET is connected to said first signal input terminal; a gate electrode of said second FET is connected to said second signal input terminal; a source electrode of said first FET, a source electrode of said second FET, a gate electrode and a drain electrode of said third FET, a gate electrode of said fourth FET, a gate electrode of said fifth FET and a non-inverting input terminal of said comparator are all connected; a drain electrode of said first FET is connected to a drain electrode of said fourth FET; a drain electrode of said second FET is connected to a drain electrode of said fifth FET; a gate electrode and a drain electrode of said sixth FET, a source electrode of said seventh FET, a gate electrode of said eighth FET and an inverting input terminal of said comparator are all connected; a drain electrode of said seventh FET is connected to a drain electrode of said eighth FET; a source electrode of said third FET and a source electrode of said sixth FET are both connected to said ground terminal; a source electrode of said fourth FET, a source electrode of said fifth FET, a gate electrode of said seventh FET and a source electrode of said eighth FET are all connected to said power source terminal; and an output of said comparator is connected to said output terminal.

* * * * *